United States Patent
Halbert et al.

(10) Patent No.: US 10,108,512 B2
(45) Date of Patent: Oct. 23, 2018

(54) VALIDATION OF MEMORY ON-DIE ERROR CORRECTION CODE

(71) Applicant: Intel Corporation, Santa Clara, CA (US)

(72) Inventors: John B. Halbert, Beaverton, OR (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 15/089,316

(22) Filed: Apr. 1, 2016

(65) Prior Publication Data

US 2017/0286197 A1 Oct. 5, 2017

(51) Int. Cl.
*G06F 11/22* (2006.01)
*G06F 11/00* (2006.01)
*G06F 11/10* (2006.01)
*G11C 29/52* (2006.01)

(52) U.S. Cl.
CPC ........ *G06F 11/2215* (2013.01); *G06F 11/008* (2013.01); *G06F 11/1068* (2013.01); *G11C 29/52* (2013.01)

(58) Field of Classification Search
CPC .............. G06F 11/008; G06F 11/1068; G06F 11/1004; G06F 11/1048; G06F 11/108; G06F 11/1052; G06F 11/2215; G11C 29/52; G11C 29/42; G11C 2029/0411; H03M 13/29
See application file for complete search history.

(56) References Cited

U.S. PATENT DOCUMENTS

| | | | | |
|---|---|---|---|---|
| 7,321,996 | B1 * | 1/2008 | Draper | G06F 11/2215 714/703 |
| 8,555,148 | B2 * | 10/2013 | Pi | H03M 13/09 714/755 |
| 2004/0225943 | A1 | 11/2004 | Brueggen | |
| 2004/0243887 | A1 * | 12/2004 | Sharma | H03M 13/47 714/52 |

(Continued)

FOREIGN PATENT DOCUMENTS

WO 2005029469 3/2005

OTHER PUBLICATIONS

R. Datta and N. A. Touba, "Post-manufacturing ECC customization based on Orthogonal Latin Square codes and its application to ultra-low power caches," 2010 IEEE International Test Conference, Austin, TX, 2010, pp. 1-7.*

(Continued)

*Primary Examiner* — Cynthia Britt
(74) *Attorney, Agent, or Firm* — Compass IP Law PC (57) ABSTRACT

Embodiments are generally directed to validation of memory on-die error correction code. An embodiment of a memory device includes one or more memory arrays for the storage of data; control logic to control operation of the memory device; and ECC (error correction code) logic, including ECC correction logic to correct data and ECC generation logic to generate ECC code bits and store the ECC bits in the one or more memory arrays. In a validation mode to validate operation of the ECC logic, the control logic is to allow generation of ECC code bits for a first test value and disable generation of ECC code bits for a second test value.

20 Claims, 5 Drawing Sheets

(56) References Cited

U.S. PATENT DOCUMENTS

| | | | |
|---|---|---|---|
| 2005/0036371 A1* | 2/2005 | Kushida | G06F 11/1008 |
| | | | 365/201 |
| 2006/0161831 A1* | 7/2006 | Mehalel | G06F 1/32 |
| | | | 714/758 |
| 2007/0113155 A1 | 5/2007 | Takahashi | |
| 2011/0239083 A1* | 9/2011 | Kanno | G06F 11/1068 |
| | | | 714/756 |
| 2011/0307758 A1 | 12/2011 | Fillingim | |
| 2012/0266033 A1* | 10/2012 | Gold | G06F 11/1052 |
| | | | 714/718 |
| 2013/0254626 A1 | 9/2013 | Pawlowski et al. | |
| 2016/0364280 A1* | 12/2016 | Perner | G06F 11/1008 |
| 2017/0046218 A1* | 2/2017 | Krishnappa | G06F 11/10 |

OTHER PUBLICATIONS

Itnternational Search Results and Written Opinion for PCT Application No. PCT/US2017/017236 dated May 19, 2017, 10 pages.

"ECC Memory", Wikipedia, https://en.eikipedia.org/wiki/ECC-memory, Dec. 2015, 7 pages.

Warren, Henry S., "Error Correcting Codes", Hacker's Delight, Second Edition 2007, 27 pages.

Alchesky, Larry C., et al., "Single-Bit-Errors; A Memory Module Supplier's Perspective on Cause, Impact, and Detection", Smart Modular Technologies, Inc., 13 pages.

Dopson, Dave, "SoftECC: A System for Software Memory Integrity Checking", Massachusetts Institute of Technology, Sep. 2005, 36 pages.

Fiala, David, et al., "A Tunable, Software-Based DRAM Error Detection and Correction Library for HPC", Department of Computer Science, et al., 10 pages.

Fiala, David , et al., "Detection and Correction of Silent Data Corruption for Large-Scale High-Performance Computing", SC '12 Proceedings of the International Conference on High Performance Computing, Networking, Storage and Analysis, Article No. 78, Nov. 10-16 2012, 12 pages.

JEDEC Standard, "DDR4 SDRAM", JESD79-4A, JEDEC Solid State Technology Association, Nov. 2013, 218 pages.

Richter, Michael , et al., "New Linear SEC-DED Codes with Reduced Triple Error Miscorrection Probability", Potsdam University, 14th IEEE International On-line Testing Symposium 2008 6 pages.

* cited by examiner

VALIDATION OF MEMORY ON-DIE ERROR CORRECTION CODE

TECHNICAL FIELD

Embodiments described herein generally relate to the field of electronic devices and, more particularly, to validation of memory on-die error correction code.

BACKGROUND

For computer memory, error correction is an essential component as certain error will occur in operation. As the speed and density of memory increases, the need for effective error correction also increases.

In modern computer memory, the error correction includes on-die ECC (error correction code) logic to correct certain errors, such as single bit errors.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to validation of memory on-die error correction code.

For the purposes of this description, the following apply:

"Error-correcting code" or "ECC" refers to the process of adding additional data to certain computer data such that the original data can be recovered when a certain number of errors are introduced into the data. In certain implementations the additional data can be stored separately from the computer data in different memory locations.

"ECC memory" refers to computer memory including on-die ECC logic. ECC memory may include, but is not limited to, SDRAM (Synchronous Dynamic Random Access Memory) such as DDR4 (Double Data Rate, Fourth Generation) memory, referring to JEDEC DDR4 Standard JESD79-4, November 2013, and DDR4E (DDR version 4, extended) memory, referring to the extension of DDR4.

The handling of certain errors by ECC memory, such as double bit errors, may not be defined for a memory technology, and thus there is a need for validation of the ECC operation. The use of on-die ECC prevents certain validation operations. In particular, the direct modification of data without affecting ECC bits is prevented because the ECC bits are not generated until the underlying data has been stored.

In some embodiments, an apparatus, system, or method provides for validation of on-die ECC logic of ECC memory. A computer may include on-die ECC, referring to error correction logic that is located on or inside the computer die. In some embodiments, an apparatus, system, or method provides for blocking generation of ECC code values to allow for modification of stored data without recalculating the ECC code values.

ECC memory includes on-die ECC to correct errors, which may be limited to correction of single bit errors. For such memory, there may be a requirement regarding how the ECC code should handle double bit errors without requiring a particular process. For example, a particular H-Matrix ECC code may not be mandated, with memory suppliers having the responsibility to select a code that behaves as required.

In particular, it may be required that an ECC H-Matrix be selected such that, upon the ECC code attempting to correct a double bit error because of aliasing and generating a triple bit error, the ECC code is to then map the aliased triple bit error in a specific manner. However, the memory would not be aware that the triple bit error has occurred. Specifically, in the case of an aliased triple bit error, if the double bit error occurs in a top half of the code word, the code is constructed such that the miscorrection will occur in the bottom half of the code word. Similarly, if a double bit error occurs in the bottom half of the code word, then the miscorrection will occur in the top half of the code word. The code then provides that the code words are read out such that triple bit errors are not read out to the data pins.

Specifically, for a x16 (16-bit data width of the DRAM chips) device, two code words are read from two banks, with half of the code word from one code word being mapped to DQ[0:7] and the same code word half of the other code word being mapped to DQ[8:15]. By mapping two code word halves for x16, any double bit errors that might be miscorrected into triple bit errors will not propagate to the DQ pins.

For a x8 device, the top code word half is mapped to one column (N) access and the bottom code word half is mapped to the N+1 column access. With this mapping, any double bit error that occurs in N or N+1 that might be aliased into a triple bit error, the aliased third error should always show up in the other column access (N+1, N). Further, for x4 device has the Code Word into divided into four column accesses (N, N+1, N+2, N+3). The top code word half is mapped to N and N+1, the bottom code word half is mapped to N+2 and N+3.

In this manner, an aliased three-bit error is read out in data as a double bit error, and the third bit of the triple-bit error is not included in such data. Stated in another manner, two bits of the triple bit error are mapped to the data that is to be reported (including a first portion of the data word), and the remaining third bit of the error is mapped to data that is not included is such data (a second portion of the data word), and thus the miscorrected third bit of the error is dropped.

As each memory supplier may develop the supplier's own code and the supplier's own physical implementation, an apparatus, system, or method is needed to validate that, after fabrication (post silicon), the ECC implementation of ECC memory behaves as required.

However, the conventional method of seeding errors from the central processing unit (CPU) or other processor into memory for ECC testing will not work to validate the on-die ECC logic within the DRAM. The reason for this failure is that, with on-die ECC logic in the DRAM, any error that injected into the memory via the conventional method from the CPU will be ignored by the DRAM. With on-die ECC, the check code is created after data has been received by the DRAM data pins, and the injection of an error will thus result in a corrected check code that takes into account the injected error.

It is possible alternatively to provide certain other operational modifications to generate internal errors in ECC memory, but such operations generally will not allow accurate testing of the ECC logic. For example, changing the refresh time of a DRAM may operate to create internal errors. However, such internal errors are essentially random, and thus the process lacks control of which bit or bits in the data will be flipped, which prevents accurate testing of the ECC logic.

In some embodiments, in order to provide accurate testing of operation of on-die ECC, an apparatus, system, or process provides bit by bit control to flip check bits in the array, and thereby generate data with a known error (which is referred to as poisoned data), without the DRAM generating ECC check bits in response to the flipped bit values. In this manner, precise control of how errors are created and corrected or aliased into triple bits can be maintained. In some embodiments, a controller is applied to affect only regeneration of check bits, thereby resulting in the controlled injection of errors into the memory array. In some embodiments, an apparatus, system, or process allows for validation of on-die ECC logic operation without requiring knowledge of the particular error correction code matrix utilized in the on-die ECC logic.

In memory operation, the ECC check bits for an ECC memory may include sufficient data to correct any single bit error. However, the ECC check bits do not include enough data to correct a two-bit error, and thus two-bit errors should pass without correction. In operation, the CPU is capable of detecting a two-bit error and thus can take appropriate measures to address the error, but the CPU generally cannot detect errors with greater than two errors.

Because of aliasing in which a double bit error will be mistaken for a single-bit error, the ECC logic of a memory will occasionally attempt to correct a double bit (rather than pass through the error), and will then generate a triple bit error. In operation, to ensure that the CPU is presented with a two-bit error that can be detected, two bits of the triple bit error are to be presented in the data value for the CPU, and the third bit of the triple bit error is mapped to a second half of the code word that is not reported in the data value for the CPU.

In some embodiments, in a read cycle for a certain data value, if a single bit has been changed during the previous write cycle (utilizing the blocked check bit write for a poisoned data value with a single flipped bit), the on-die ECC logic (if operating properly) corrects the data before returning the data to the CPU. The ECC check bits include sufficient data to correct any single bit error. In some embodiments, a validating unit (which may be, for example, the CPU, another processor, or a separate testing unit) may determine proper operation of the on-die ECC logic by inspection of the data that is written to and read from the ECC memory.

In some embodiments, if two bits are changed (utilizing the blocked check bit write for a data value with two flipped bits), the on-die ECC logic can (in certain cases) detect and report the two-bit error. The on-die ECC can (in certain cases) mistakenly miscorrect the double bits into triple bits, the on-die ECC then reporting two of the error bits of the three-bit error as a two-bit error in a data value that is reported, with a remaining single bit error not being included in the data value. Without validation of such operation, a system is at risk of silent data corruption that is not detected by the CPU.

In some embodiments, an apparatus, system, or method operates to modify the DRAM array values without modifying the ECC data stored in the array during a write cycle, and to utilize this operation to change bits from the previous data value in a known way. In some embodiments, the DRAM array values are modified by allowing the generation of check data values for a first data value and blocking the generation of a new check data value for a second data value, resulting in a controlled modification of the data (as the new second data value may be stored with specific bits flipped from the previous stored first data value) without resulting in new check data values (because the generation of the ECC data is disabled, and thus the ECC data for the previous stored data remains stored).

In an example, it may be assumed that a first data value (Data-1) is initially stored in a memory, and second data value (Data-2) is next stored in the memory. In some embodiments, a validation process may include modifying a certain number of bits of Data-1 to generate Data-2. For, example a particular bit (bit[j]) may be flipped to generate a one-bit error for testing, and two particular bits (bit[j] and bit [k]) may be flipped to generate a two-bit error for testing, where bit[j] and bit[k] may be any bits of the stored data.

In some embodiments, if a single bit is changed in the stored data during a write cycle with a blocked check bit write (generation of ECC code disabled), then in a subsequent read cycle the on-die ECC logic should correct the data before returning the data to the CPU, and thus the validating unit can determine proper data correction operation by the on-die ECC. If two bits are changed during the blocked check bit write, the on-die ECC logic should (in some cases) mistakenly correct the double bits into triple bits, and on a subsequent read cycle the on-die ECC should pass a double-bit error in the reported data, with the third error bit not being included in the data value, the third error bit being mapped to a second half of a data word that is not reported in such data value. It is known that certain patterns will generate triple bit errors, but, if the on-die ECC is operating correctly, a controller should not see any triple bit errors in the reported data resulting from the test data. In this manner, in a validation mode in which a known double bit error is injected into a memory, this case of miscorrected triple bit errors can then be validated by the validating unit (such as the CPU, another processor, or a separate testing unit). If the on-die ECC operation is validated in the validation mode, then the H-Matrix ECC code for the on-die ECC may be determined to be acceptable.

In some embodiments, an apparatus, system, or process is to:

(1) Write a first data (Data-1) to a DRAM, the DRAM including on-die ECC logic.

(2) Calculate an ECC code for Data-1 using the on-die ECC logic and store the value in memory. The calculated ECC code (ECC-1 being the ECC code generated for Data-1) will be utilized in verification of the on-die ECC operation.

(3) Turn off (disable) calculation of ECC check bits to block the calculation of an ECC code for a following data.

(4) Write a second data (Data-2) to the DRAM, wherein Data-1 has been modified in a known way to generate Data-2, such as to flip a single bit of Data-1 (e.g., a bit[j]) to create a single bit error or to flip two bits of Data-1 (e.g., a bit[j] and a bit[k]) to create a double bit error. In this manner, a known error is injected into the memory.

The disabling of the calculation of ECC check bits for Data-2 results in leaving the existing check bits of ECC-1 (which were generated for Data-1) in place in memory, and controlling the flipping of certain bits into memory to inject errors for testing. Stated in another way, ECC-1 becomes the error code for Data-2 (or, if ECC-2 is the error code for Data-2, then ECC-2=ECC-1).

In some embodiments, in this manner, a known error is introduced into a memory, the error being the bits of Data-1 that are flipped to generate Data-2, with the flipped bits being established as an error by blocking the generation of the ECC code for Data-2 such that the prior ECC code (ECC-1 for Data-1) is the error code for Data-2. In some embodiments, an apparatus, system, or process utilizes the known error to evaluate the operation of the on-die ECC of the memory, and specifically the handling of single bit errors and double bit errors.

Figure 1:
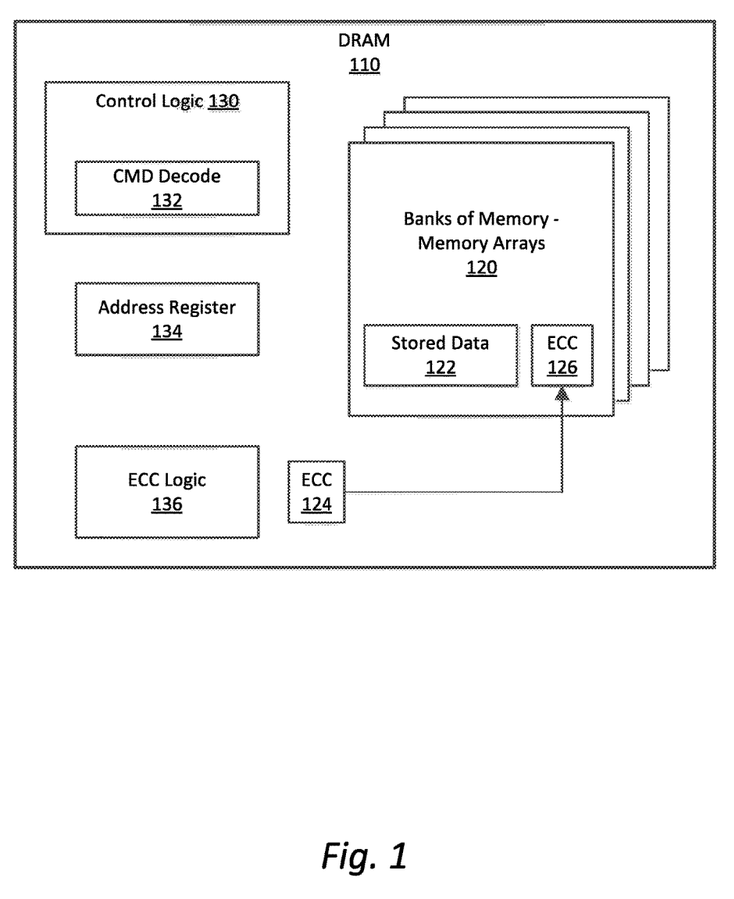
FIG. 1 is an illustration of a memory apparatus including validation of memory on-die error correction code operation according to an embodiment.

FIG. 1 is an illustration of a memory apparatus including validation of memory on-die error correction code operation according to an embodiment. In some embodiments, a DRAM memory 110, such as an SDRAM, includes banks of memory including memory arrays 120 for the storage of data values. In some embodiments, the DRAM includes control logic 130 with command decode, and an address register 134 for the receipt of memory addresses. In some embodiments, the DRAM further includes on-die ECC logic 136 to provide error correction operation. In some embodiments, the ECC logic includes ECC correction logic and ECC generation logic.

In operation, the ECC logic H-matrix will generally only correct a single bit error. For double bit error there is a certain chance (such as a 20% chance) that the system will attempt to correct the double bit error and will miscalculate to create a triple bit error. However, the DRAM 110 may be required to only present a double bit error in a read operation, and thus the memory device should report two bits of the error in a data value, with the third error bit not included in the reported data value.

However, if in accordance with a method for testing of such operation there is an attempt to poison (i.e., change) the stored value by a certain number of bits and submit the poisoned bits to DRAM, the on-die ECC will correct the received bits internally. For this reason, it is not generally possible in ECC memory to directly poison the stored data bits for validation testing by modifying the stored data.

In some embodiments, the ECC logic 136 is to calculate an ECC code 124 for stored data 126, and the ECC logic 136 writes the ECC code 124 to the memory as ECC 126 in a normal operation mode. In some embodiments, in a validation mode, the control logic 130 is operable to change one or more bits of the stored data in a new write operation, and block the generation and writing of new ECC bits for the new write of data. Accordingly, the value of certain bits of the stored data may be flipped without changing the ECC code because the generation and writing a new ECC or replacement value 126 is blocked, and the previous value of such ECC bits is retained. Stated in another way, the blocking of the writing of ECC bits allows for indirectly poisoning the stored data without modification of the previously calculated ECC bits in a validation operation.

Figure 2A:
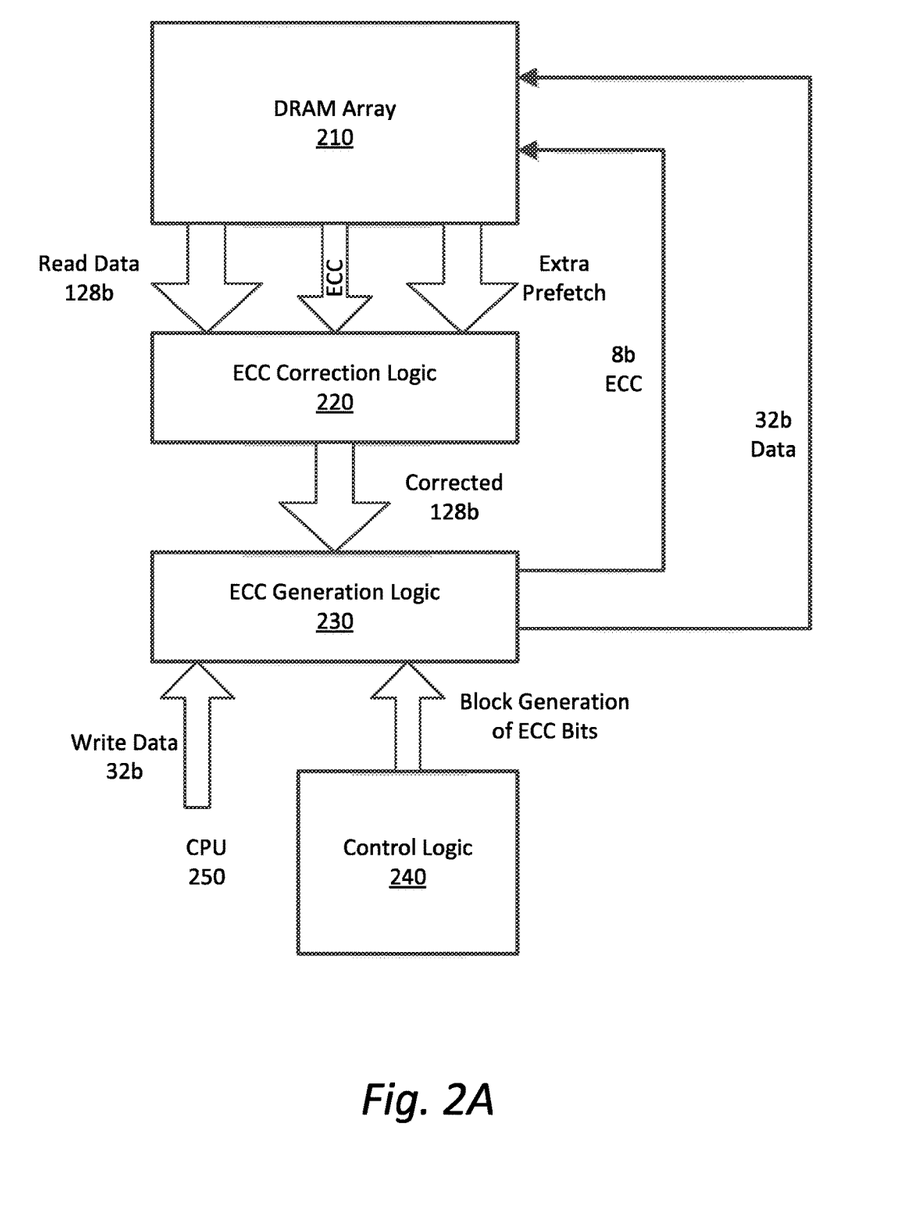
FIG. 2A is an illustration of a write process for error correction validation according to an embodiment.

FIG. 2A is an illustration of a write process for error correction validation according to an embodiment. As illustrated in FIG. 2A, a validation operation utilizes the operation of a DRAM array 210, on-die ECC correction logic 220, on-die ECC generation logic 230, and control logic 240. (In this example, an x4 memory device, 4-bit data width of the DRAM chips, is provided, but the memory may also be, for example, an x8 memory device in a similar process, or an x16 memory without requiring the prefetch of data.)

In an example write cycle, the on-die ECC correction logic reads 128 data bits from the DRAM array 210 along with 8 check bits. In parallel the CPU 250 sends 32 data bits (write data) to the DRAM to be written. The 128 data bits are first checked for ECC errors, with any single bit errors being corrected in the 128 data bits. The 32 data bits from the CPU 250 are merged into the 128 corrected data bits, and the new ECC check bits (ECC 8b) are generated and the 32 data bits from the CPU along with the newly generated check bits are written to the DRAM array 210.

On a read cycle, the 128 data bits and the 8 check bits are read from the DRAM array 210, the ECC will correct any single bit errors in the 128 data bits, and the 32 bits for the read cycle are the sent to the DQ (data) pins (which are not illustrated in FIG. 2).

In some embodiments, in order to indirectly inject errors into the DRAM array during a write cycle, the generation of error correction code bits by the ECC generation logic 230 is blocked. In some embodiments, error correction code bits are generated but are not stored in DRAM array 210, thus retaining the previous ECC value. In this way, new data bits are written to the DRAM array without changing the corresponding check bits, thus allowing for errors to be indirectly injected into data stored in the DRAM array 210. In some embodiments, the generation of new ECC bits by the ECC Generation Logic 230 is blocked by command of control logic 240, and as a result previously calculated ECC bits remain in the DRAM array, even though corresponding stored data may change.

Figure 2B:
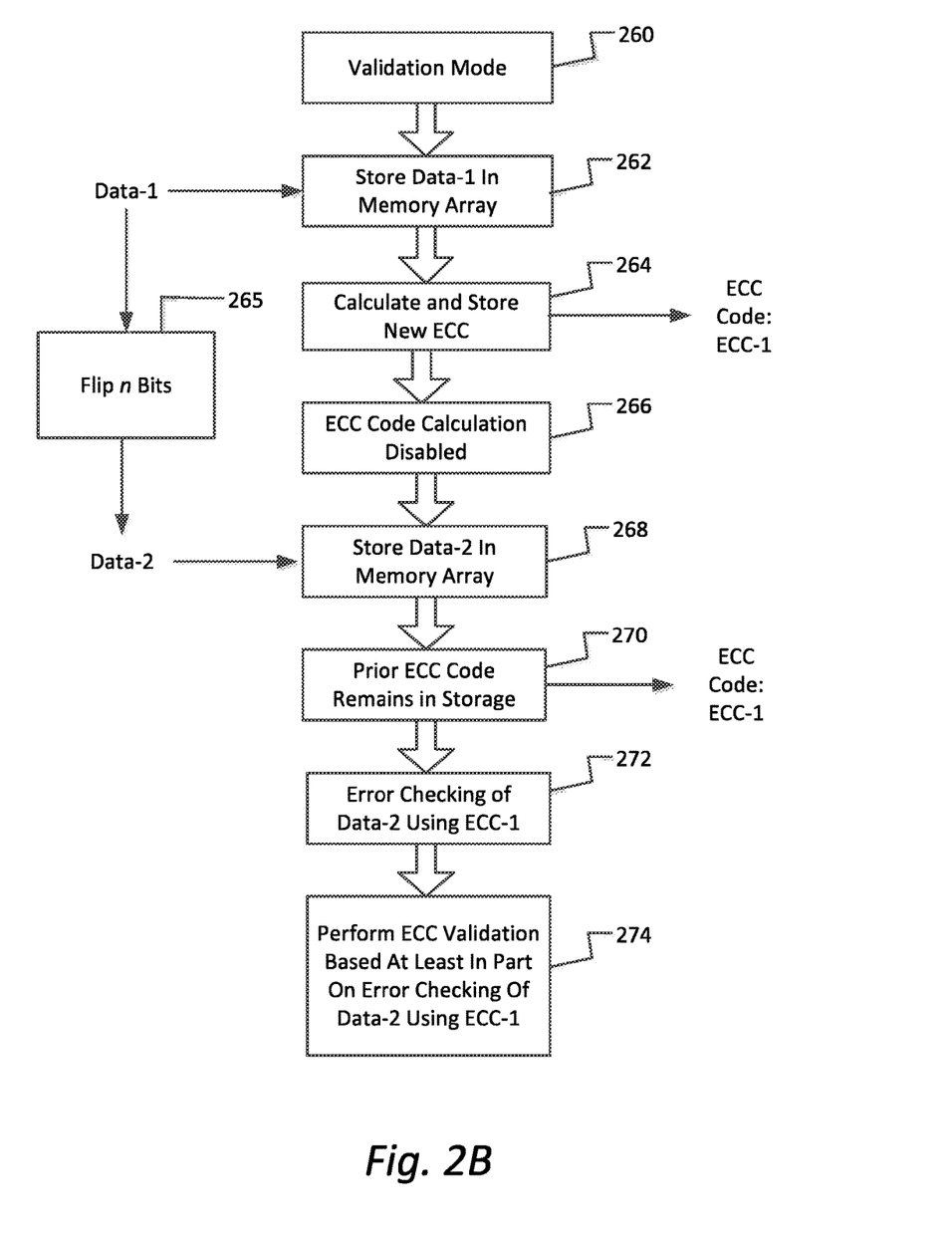
FIG. 2B is an illustration of an example of validation of on-die ECC logic of a memory device according to an embodiment.

FIG. 2B is an illustration of an example of validation by on-die ECC logic of a memory device according to an embodiment. In a validation mode of a memory 260, a first test data (Data-1) is stored in a memory array of the memory 262. In some embodiments, an on-die ECC logic is to calculate and store a new ECC code (ECC-1) for the Data-1 value 264. Thus, an error cannot be injected directly into the first data value because the ECC codes will be calculated based on the data value stored. In some embodiments, a first data value is instead used to generate a second data value with a known error while retaining the prior ECC value, and thus allow for indirect injection of the error.

In some embodiments, Data-1 is utilized to generate a second data value, Data-2, by flipping a certain number n of bits 265, such as changing one bit of Data-1 to generate a single bit error or changing two bits of Data-1 to generate a double bit error.

In some embodiments, the on-die ECC code calculation is disabled 266 to maintain ECC code values. In the illustrated example, Data-2 (which differs from Data-1 by a certain n bits) is stored in the memory array 268. In some embodiments, with the ECC code calculation by the on-die logic being disabled, the prior ECC code value (ECC-1) remains in storage 270.

In some embodiments, the on-die ECC performs error checking of Data-2 using ECC-1 272 because the ECC value has not changed. In some embodiments, validation of the on-die ECC logic is performed by a validating unit (such as the CPU, another processor, or a separate testing unit) 274, wherein the validation of the on-die ECC logic is based at least in part on the error-checking of Data-2 using ECC-1.

Figure 3:
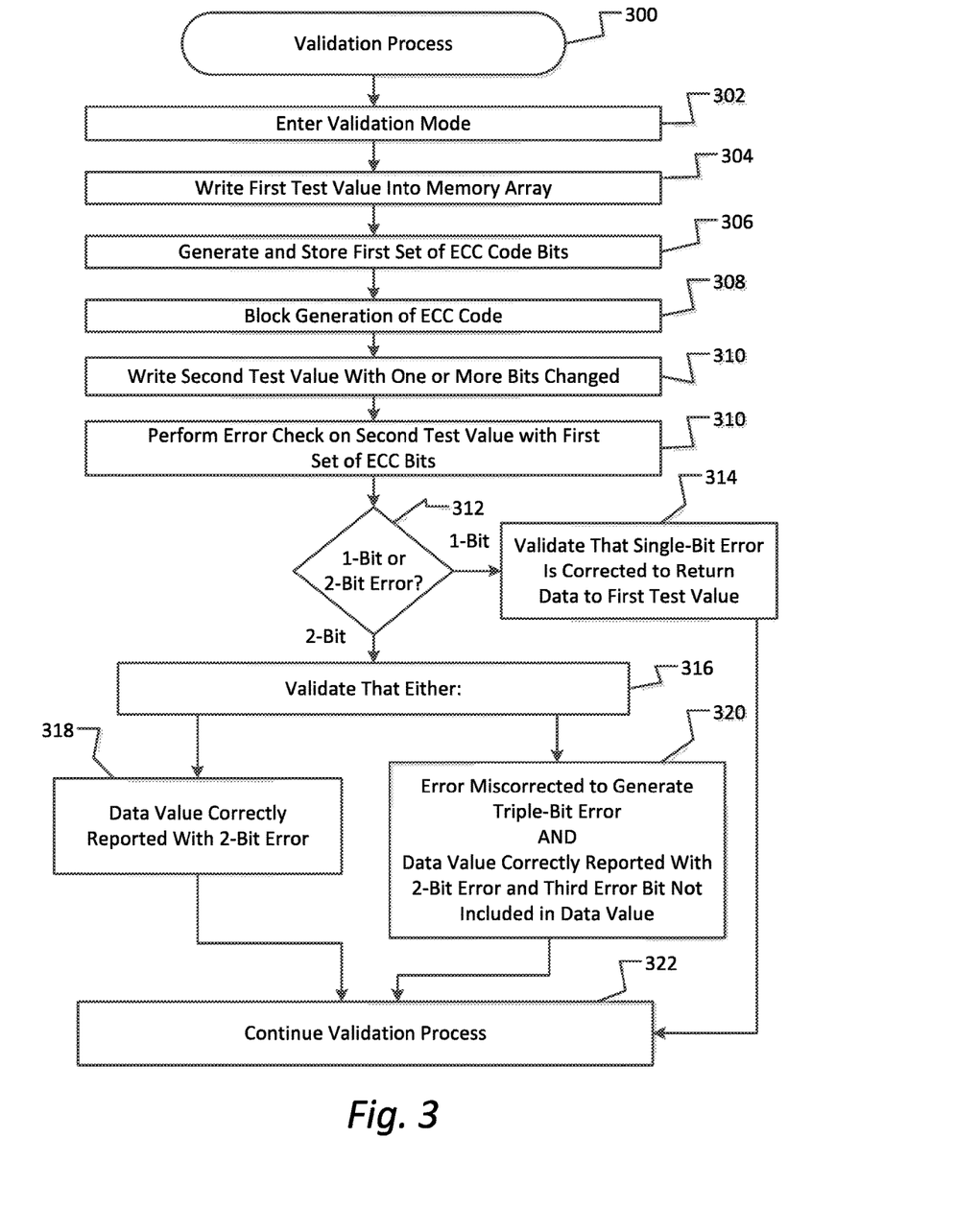
FIG. 3 is a flow chart to illustrate a process for validation of memory on-die ECC operation according to an embodiment.

FIG. 3 is a flow chart to illustrate a process for validation of memory on-die ECC operation according to an embodiment. In some embodiments, a validation process (where validation may be performed by a validating unit, such as a system CPU or other processor or a separate testing unit)

300 includes entering a validation mode 302, wherein the validation mode refers to any mode or operation to provide for validation of operation of the on-die ECC logic of a memory device.

In some embodiments, the process includes writing a first test value 304 into a memory array and generating first ECC code bits 306. In some embodiments, generation of ECC code values is then blocked 308. In some embodiments, the process proceeds with writing a second test value to memory, wherein one or more bits of the first test value are flipped in the second test value 310. In a particular validation operation the number of bits changed are either one or two bits, but embodiments are not limited to the change of any particular number of bits. In some embodiments, because the generation of a second ECC code for the write of the second test value is blocked, thereby preventing the change of the ECC bits in response to the write of the modified data, the storing of the second test value results in creating a particular known error, such as a single bit error or a double bit error representing the flipping of the one or two bits of the first test value to create the second test value.

In some embodiments, the validation process then proceeds based on whether the introduced error is a single bit error or a double bit error 312. For a single bit error 312, the process proceeds with a validation that the single bit error (i.e., the one bit flipped from the first test value) is corrected by the on-die ECC logic 314. Thus, the memory device should correct the second test value data to match the first test value data.

For a double bit error 312, in normal operation, a double bit error may be recognized as a double bit error or, in certain cases, the double bit error may be miscorrected to generate a triple bit error. In some embodiments, a validation process may proceed with validating that either 316:

The error is properly reported out as a double bit error in a data value 318; or The error is miscorrected to generate a triple bit error, and the triple bit error is properly reported out as a double bit error in a data value, with a remaining third error bit not included in the reported data value 320. If the on-die ECC is operating correctly, the reported data should not contain triple bit errors resulting from the test data.

The validation process then may continue as appropriate 322. If the on-die ECC operation is validated in the validation process, then the H-Matrix ECC code for the on-die ECC may be determined to be acceptable.

Figure 4:
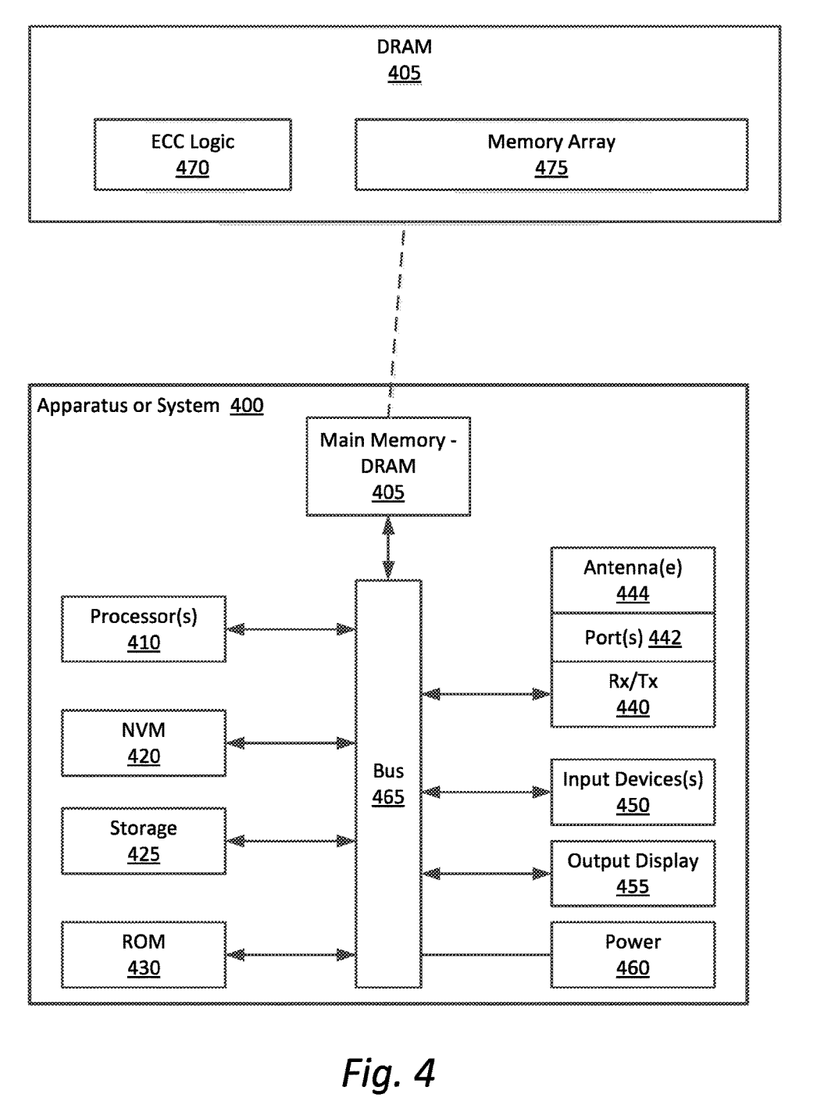
FIG. 4 is an illustration of an embodiment of an apparatus or system according to an embodiment.

FIG. 4 is an illustration of an embodiment of an apparatus or system according to an embodiment. In this illustration, certain standard and well-known components that are not germane to the present description are not shown. Elements shown as separate elements may be combined, including, for example, an SoC (System on Chip) combining multiple elements on a single chip.

In some embodiments, an apparatus or system 400, such as a computing system, includes processing means such as one or more processors 410 coupled to one or more buses or interconnects, shown in general as bus 465. The processors 410 may comprise one or more physical processors and one or more logical processors. In some embodiments, the processors 410 may include one or more general-purpose processors or special-processor processors. The bus 465 is a communication means for transmission of data. The bus 465 is illustrated as a single bus for simplicity, but may represent multiple different interconnects or buses and the component connections to such interconnects or buses may vary. The bus 465 shown in FIG. 4 is an abstraction that represents any one or more separate physical buses, point-to-point connections, or both connected by appropriate bridges, adapters, or controllers.

In some embodiments, the apparatus or system 400 comprises a random access memory (RAM) or other dynamic storage device or element as a main memory 405 for storing information and instructions to be executed by the processors 410. Main memory 410 may include, but is not limited to, dynamic random access memory (DRAM).

In some embodiments, the DRAM 405 includes on-die ECC logic 470, which may include the ECC logic 136 illustrated in FIG. 1, and may include the ECC correction logic 220 and ECC generation logic 230 illustrated in FIG. 2A. In some embodiments, the DRAM 405 further includes one or more memory arrays 475, wherein the DRAM is to block generation of ECC code bits for the purpose of changing stored data values in the memory array 475 without modifying ECC values, thus allowing for validation of on-die ECC operation.

The apparatus or system 400 also may comprise a non-volatile memory (NVM) 420; a storage device such as a solid state drive (SSD) 425; and a read only memory (ROM) 430 or other static storage device for storing static information and instructions for the processors 410.

Any memory device described herein may include, for example, block addressable memory device, such as NAND or NOR technologies, phase change memory (PCM), three dimensional cross point memory, or other byte addressable nonvolatile memory devices, memory devices that use chalcogenide phase change material (e.g., chalcogenide glass), resistive memory, nanowire memory, ferro-electric transistor random access memory (FeTRAM), flash memory such as solid state disk (SSD) NAND or NOR, multi-threshold level NAND flash memory, NOR flash memory, magnetoresistive random access memory (MRAM) memory that incorporates memristor technology, spin transfer torque (STT)-MRAM, or a combination of any of the above, or other memory.

In some embodiments, the apparatus or system 400 includes one or more transmitters or receivers 440 coupled to the bus 465 to provide wired or wireless communications. In some embodiments, the apparatus or system 400 may include one or more antennae 444, such as dipole or monopole antennae, for the transmission and reception of data via wireless communication using a wireless transmitter, receiver, or both, and one or more ports 442 for the transmission and reception of data via wired communications. Wireless communication includes, but is not limited to, Wi-Fi, Bluetooth™, near field communication, and other wireless communication standards.

In some embodiments, the apparatus or system 400 may include one or more input devices 450 for the input of data, including hard and soft buttons, a joy stick, a mouse or other pointing device, a keyboard, voice command system, or gesture recognition system.

In some embodiments, the apparatus or system 400 may include an output display 455, where the display 455 may include a liquid crystal display (LCD) or any other display technology, for displaying information or content to a user. In some environments, the display 455 may include a touch-screen that is also utilized as at least a part of an input device 450. The apparatus or system 400 may further include audio output, including one or more speakers, audio output jacks, or other audio, and other output to the user.

The apparatus or system 400 may also comprise a battery or other power source 460, which may include a solar cell, a fuel cell, a charged capacitor, near field inductive coupling, or other system or device for providing or generating power in the apparatus or system 400. The power provided by the power source 460 may be distributed as required to elements of the apparatus or system 400.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a memory device includes one or more memory arrays for the storage of data; control logic to control operation of the memory device; and ECC (error correction code) logic, including ECC correction logic to correct data and ECC generation logic to generate ECC code bits and store the ECC bits in the one or more memory arrays. In some embodiments, in a validation mode to validate operation of the ECC logic, the control logic is to allow generation of ECC code bits for a first test value and disable generation of ECC code bits for a second test value.

In some embodiments, the memory device is to write the first test value in a memory array, generate a first set of ECC bits for the first test value, write the second test value in the memory array, and maintain the first set of ECC bits for the second test value.

In some embodiments, the validation mode includes the ECC logic to perform an error check of the second test value using the first set of ECC bits.

In some embodiments, the second test value differs from the first test by a single flipped bit value, and wherein the validation mode is to validate whether a single bit error represented by the single flipped bit value is co.

In some embodiments, the correction of the single bit error is to correct the second test value to be the first test value.

In some embodiments, the second test value differs from the first test by two flipped bit values, wherein the validation mode is to validate whether either: a double bit error represented by the two flipped bit values is correctly read out; or the double bit error represented by the two flipped bit values is miscorrected into a triple bit error, and a double bit error represented by two bit values of the triple bit error is correctly read out in a data value with a third bit value of the triple bit error not being included in the reported data value.

In some embodiments, the validation of operation of the ECC logic is performed by one of a central processing unit (CPU) of a system, another processor of the system, or a separate testing unit.

In some embodiments, one or more non-transitory computer-readable storage mediums having stored thereon data representing sequences of instructions that, when executed by one or more processors, cause the one or more processors to perform operations comprising: writing a first test value in a computer memory; generating a first set of ECC (error correction code) code bits by an on-die ECC logic of the computer memory in response to the writing of the first test value; blocking generation of ECC code bits by a memory controller of the computer memory; and writing a second test value in the computer memory, the second test value differing from the first test value by one or more bits.

In some embodiments, the one or more mediums further include instructions for performing an error check of the second test value based on the first set of ECC code bits.

In some embodiments, the one or more mediums further include instructions for validating operation of the on-die ECC logic based at least in part on the error check of the second test value based on the first set of ECC code bits.

In some embodiments, the second test value differs from the first test value by a single bit value; and the one or more mediums further include instructions for validating whether a single bit error represented by the single bit value is corrected.

In some embodiments, validating whether the single bit error is corrected includes determining whether the second test value is corrected to be the first test value.

In some embodiments, the second test value differs from the first test value by a double bit value; and the one or more mediums further include instructions for validating whether: a double bit error represented by the double bit value is correctly read out, or the double bit error represented by the two flipped bit values is miscorrected into a triple bit error, and a double bit error represented by two bit values of the triple bit error is correctly read out in a data value, with a third bit value of the triple bit error not included in the data value.

In some embodiments, validation of operation of the ECC logic is performed by one of a central processing unit (CPU) of a system, another processor of the system, or a separate testing unit.

In some embodiments, a computing system includes one or more processors; and synchronous dynamic random access memory (SDRAM) for the storage of data, the SDRAM including a memory device having: one or more memory arrays for the storage of data, control logic to control operation of the memory device, and ECC (error correction code) logic, including ECC correction logic to correct data and ECC generation logic to generate ECC code bits and store the ECC bits in the one or more memory arrays. In some embodiments, in a validation mode to validate operation of the ECC logic, the control logic is to allow generation of ECC code bits for a first test value and disable generation of ECC code bits for a second test value.

In some embodiments, the memory device is to write the first test value in a memory array, generate a first set of ECC bits for the first test value, write the second test value in the memory array, and maintain the first set of ECC bits for the second test value.

In some embodiments, the validation mode includes the ECC logic to perform an error check of the second test value using the first set of ECC bits.

In some embodiments, the second test value differs from the first test by a single flipped bit value, and wherein the memory device is to validate whether a single bit error represented by the single flipped bit value is corrected.

In some embodiments, the correction of the single bit error is to correct the second test value to be the first test value.

In some embodiments, the second test value differs from the first test by two flipped bit values, wherein the memory device is to validate whether either: a double bit error represented by the two flipped bit values is correctly read out, or the double bit error represented by the two flipped bit values is miscorrected into a triple bit error, and a double bit error represented by two bit values of the triple bit error is correctly read out in a data value with a third bit value of the triple bit error not being included in the data value.

In some embodiments, validation of operation of the ECC logic is performed by one of a processor of the computing system or a separate testing unit.

In some embodiments, the computing system includes one or more of: a display communicatively coupled to the one or more processors; a network interface communicatively coupled to the one or more processors; or a battery coupled to the one or more processors.

In some embodiments, an apparatus includes means for writing a first test value in a computer memory; means for generating a first set of ECC (error correction code) code bits by an on-die ECC logic of the computer memory in response to the writing of the first test value; means for blocking generation of ECC code bits by a memory controller of the computer memory; and means for writing a second test value in the computer memory, the second test value differing from the first test value by one or more bits.

In some embodiments, the apparatus further includes means for performing an error check of the second test value based on the first set of ECC code bits.

In some embodiments, the apparatus further includes means for validating operation of the on-die ECC logic based at least in part on the error check of the second test value based on the first set of ECC code bits.

In some embodiments, the second test value differs from the first test value by a single bit value; and the apparatus further includes means for validating whether a single bit error represented by the single bit value is corrected.

In some embodiments, the means for validating whether the single bit error is corrected includes means for determining whether the second test value is corrected to be the first test value.

In some embodiments, the second test value differs from the first test value by a double bit value; and the apparatus further includes means for validating whether: a double bit error represented by the double bit value is correctly read out, or the double bit error represented by the two flipped bit values is miscorrected into a triple bit error, and a double bit error represented by two bit values of the triple bit error is correctly read out in a data value with a third bit value of the triple bit error not being included in the data value.

In some embodiments, validation of operation of the on-die ECC logic is performed by one of a central processing unit (CPU) of a system, another processor, or a separate testing unit.

In some embodiments, a method includes writing a first test value in a computer memory; generating a first set of ECC (error correction code) code bits by an on-die ECC logic of the computer memory in response to the writing of the first test value; blocking generation of ECC code bits by a memory controller of the computer memory; and writing a second test value in the computer memory, the second test value differing from the first test value by one or more bits.

In some embodiments, the method further includes performing an error check of the second test value based on the first set of ECC code bits.

In some embodiments, the method further includes validating operation of the on-die ECC logic based at least in part on the error check of the second test value based on the first set of ECC code bits.

In some embodiments, the second test value differs from the first test value by a single bit value; and the method further includes validating whether a single bit error represented by the single bit value is corrected.

In some embodiments, validating whether the single bit error is corrected includes determining whether the second test value is corrected to be the first test value.

In some embodiments, the second test value differs from the first test value by a double bit value; and the method further includes validating whether: a double bit error represented by the double bit value is correctly read out, or the double bit error represented by the two flipped bit values is miscorrected into a triple bit error, and a double bit error represented by two bit values of the triple bit error is correctly read out in a data value with a third bit value of the triple bit error not being included in the data value.

In some embodiments, validation of operation of the on-die ECC logic is performed by one of a central processing unit (CPU) of a system, another processor, or a separate testing unit.

What is claimed is:

1. A memory device comprising:
one or more memory arrays for storage of data;
control logic to control operation of the memory device; and
on-die ECC (error correction code) logic, including on-die ECC correction logic to correct data and on-die ECC generation logic to generate ECC code bits and store the ECC bits in the one or more memory arrays;
wherein, in a validation mode in which a host system that is coupled to the memory device desires to confirm that the on-die ECC logic operates correctly, to validate operation of the on-die ECC logic, the control logic is to allow generation of ECC code bits for a first test value and disable generation of ECC code bits for a second test value, wherein the second test value is the first test value with an error, so that the ECC code bits are useable by the on-die ECC logic to correct the error in the second test value and thereby confirm valid operation of the on-die ECC logic.

2. The memory device of claim 1, wherein the memory device is to write the first test value in a memory array, generate a first set of ECC bits for the first test value, write the second test value in the memory array, and maintain the first set of ECC bits for the second test value.

3. The memory device of claim 2, wherein the validation mode includes the on-die ECC logic to perform an error check of the second test value using the first set of ECC bits.

4. The memory device of claim 3, wherein the second test value differs from the first test value by a single flipped bit value, and wherein the validation mode is to validate whether a single bit error represented by the single flipped bit value is corrected.

5. The memory device of claim 4, wherein the correction of the single bit error is to correct the second test value to be the first test value.

6. The memory device of claim 3, wherein the second test value differs from the first test value by two flipped bit values, wherein the validation mode is to validate whether either: a double bit error represented by the two flipped bit values is correctly read out; or the double bit error represented by the two flipped bit values is miscorrected into a triple bit error, and a double bit error represented by two bit values of the triple bit error is correctly read out in a data value with a third bit value of the triple bit error not being included in the data value.

7. The memory device of claim 1, wherein validation of operation of the on-die ECC logic is performed by one of a central processing unit (CPU) of a system, another processor of the system, or a separate testing unit.

8. One or more non-transitory computer-readable storage mediums having stored thereon data representing sequences of instructions that, when executed by one or more processors, cause the one or more processors to perform operations comprising:
writing a first test value in a computer memory;
generating a first set of ECC (error correction code) code bits by an on-die ECC logic of the computer memory in response to the writing of the first test value;
blocking generation of ECC code bits by a memory controller of the computer memory;
writing a second test value in the computer memory, the second test value differing from the first test value by one or more bits;
performing an error check of the second test value based on the first set of ECC code bits; and,
validating operation of the on-die ECC logic based at least in part on the error check of the second test value based on the first set of ECC code bits including verifying that the ECC code bits were useable by the on-die ECC logic to correct the second test value.

9. The one or more mediums of claim 8, wherein the second test value differs from the first test value by a single bit value; and further comprising instructions that, when executed by the one or more processors, cause the one or more processors to perform operations comprising: validating whether a single bit error represented by the single bit value is corrected.

10. The one or more mediums of claim 9, wherein validating whether the single bit error is corrected includes determining whether the second test value is corrected to be the first test value.

11. The one or more mediums of claim 8, wherein the second test value differs from the first test value by a double bit value; and further comprising instructions that, when executed by the one or more processors, cause the one or more processors to perform operations comprising:
validating whether: a double bit error represented by the double bit value is correctly read out, or the double bit error represented by the two flipped bit values is miscorrected into a triple bit error, and a double bit error represented by two bit values of the triple bit error is correctly read out in a data value with a third bit value of the triple bit error not being included in the data value.

12. The one or more mediums of claim 8, wherein validation of operation of the on-die ECC logic is performed by one of a central processing unit (CPU) of a system, another processor of the system, or a separate testing unit.

13. A computing system comprising:
one or more processors; and
synchronous dynamic random access memory (SDRAM) for storage of data, the SDRAM including a memory device having:
one or more memory arrays for the storage of data,
control logic to control operation of the memory device, and
on-die ECC (error correction code) logic, including on-die ECC correction logic to correct data and on-die ECC generation logic to generate ECC code bits and store the ECC bits in the one or more memory arrays;
wherein, in a validation mode in which a host system that is coupled to the memory device desires to confirm that the on-die ECC logic operates correctly, to validate operation of the on-die ECC logic, the control logic is to allow generation of ECC code bits for a first test value and disable generation of ECC code bits for a second test value, wherein the second test value is the first test value with an error, so that the ECC code bits are useable by the on-die ECC logic to correct the error in the second test value and thereby confirm valid operation of the on-die ECC logic.

14. The computing system of claim 13, wherein the memory device is to write the first test value in a memory array, generate a first set of ECC bits for the first test value, write the second test value in the memory array, and maintain the first set of ECC bits for the second test value.

15. The computing system of claim 14, wherein the validation mode includes the on-die ECC logic to perform an error check of the second test value using the first set of ECC bits.

16. The computing system of claim 15, wherein the second test value differs from the first test value by a single flipped bit value, and wherein the validation mode is to validate whether a single bit error represented by the single flipped bit value is corrected.

17. The computing system of claim 16, wherein the correction of the single bit error is to correct the second test value to be the first test value.

18. The computing system of claim 15, wherein the second test value differs from the first test value by two flipped bit values, wherein the validation mode is to validate whether either: a double bit error represented by the two flipped bit values is correctly read out; or the double bit error represented by the two flipped bit values is miscorrected into a triple bit error, and a double bit error represented by two bit values of the triple bit error is correctly read out in a data value with a third bit value of the triple bit error not being included in the data value.

19. The computing system of claim 13, wherein validation of operation of the on-die ECC logic is performed by one of a processor of the computing system or a separate testing unit.

20. The computing system of claim 13, further comprising one or more of: a display communicatively coupled to the one or more processors, a network interface communicatively coupled to the one or more processors; or a battery coupled to the one or more processors.

* * * * *